(12) United States Patent
Ahn

(10) Patent No.: US 11,121,571 B2
(45) Date of Patent: Sep. 14, 2021

(54) METHOD AND BATTERY MANAGEMENT SYSTEM FOR SMOOTHING POWER LIMIT OF BATTERY

(71) Applicant: LG CHEM, LTD., Seoul (KR)

(72) Inventor: Hyoung Jun Ahn, Daejeon (KR)

(73) Assignee: LG Chem, Ltd., Seoul (KR)

( * ) Notice: Subject to any disclaimer, the term of this patent is extended or adjusted under 35 U.S.C. 154(b) by 106 days.

(21) Appl. No.: 16/616,624

(22) PCT Filed: Jan. 17, 2019

(86) PCT No.: PCT/KR2019/000720
§ 371 (c)(1),
(2) Date: Nov. 25, 2019

(87) PCT Pub. No.: WO2019/156385
PCT Pub. Date: Aug. 15, 2019

(65) Prior Publication Data
US 2020/0195017 A1    Jun. 18, 2020

(30) Foreign Application Priority Data
Feb. 7, 2018  (KR) .................. 10-2018-0015140

(51) Int. Cl.
*H02J 7/00* (2006.01)
*H01M 10/42* (2006.01)
(Continued)

(52) U.S. Cl.
CPC ........... *H02J 7/007* (2013.01); *H01M 10/425* (2013.01); *H01M 10/44* (2013.01); *H01M 10/48* (2013.01); *H01M 2010/4271* (2013.01)

(58) Field of Classification Search
CPC .... H02J 7/007; H02J 7/00712; H02J 7/00714; H02J 7/007182; H01M 10/425; H01M 10/44; H01M 10/48; H01M 2010/4271
(Continued)

(56) References Cited

U.S. PATENT DOCUMENTS

| 8,217,628 | B2 * | 7/2012 | Yang ..................... H02J 7/0072 320/134 |
| 2009/0266631 | A1 * | 10/2009 | Kikuchi ............. B60L 15/2009 180/65.265 |

(Continued)

FOREIGN PATENT DOCUMENTS

| CN | 104898063 A | 9/2015 |
| JP | 2008-162315 A | 7/2008 |

(Continued)

OTHER PUBLICATIONS

International Search Report issued in corresponding International Patent Application No. PCT/KR2019/000720, dated May 17, 2019.
(Continued)

*Primary Examiner* — Nathaniel R Pelton
(74) *Attorney, Agent, or Firm* — Morgan, Lewis & Bockius LLP

(57) ABSTRACT

Provided is a method and a battery management system for smoothing the power limit when charging or discharging a battery. The method according to an embodiment of the present disclosure includes determining a first weighting factor based on a maximum charge voltage and a terminal voltage of the battery, determining a second weighting factor based on a previous smoothed charge power limit, a current charge power limit and a current instantaneous power, setting a smaller one of the first weighting factor and the second weighting factor as a first reference weighting factor, and smoothing the current charge power limit based on the
(Continued)

previous smoothed charge power limit and the first reference weighting factor.

12 Claims, 15 Drawing Sheets

(51) Int. Cl.
  *H01M 10/44* (2006.01)
  *H01M 10/48* (2006.01)
(58) Field of Classification Search
  USPC .......................................................... 320/107
  See application file for complete search history.

(56) References Cited

U.S. PATENT DOCUMENTS

2010/0324762 A1  12/2010  Imaseki et al.
2011/0127958 A1  6/2011  Ishishita et al.
2015/0251556 A1  9/2015  Meyer
2017/0123011 A1* 5/2017  Cha ........................ G01R 27/02

FOREIGN PATENT DOCUMENTS

| | | |
|---|---|---|
| JP | 2013-201840 A | 10/2013 |
| JP | 2014-025738 A | 2/2014 |
| JP | 5492493 B2 | 5/2014 |
| KR | 10-1021255 B1 | 3/2011 |
| KR | 10-2013-0071952 A | 7/2013 |
| KR | 10-2013-0078954 A | 7/2013 |
| KR | 10-2016-0069252 A | 6/2016 |
| KR | 10-2017-0062326 A | 6/2017 |

OTHER PUBLICATIONS

Extended European Search Report dated Oct. 26, 2020, issued in corresponding European Patent Application No. 19750984.7.
Office Action dated May 8, 2021, issued in corresponding Chinese Patent Application No. 201980002965.5.

* cited by examiner

METHOD AND BATTERY MANAGEMENT SYSTEM FOR SMOOTHING POWER LIMIT OF BATTERY

TECHNICAL FIELD

The present disclosure relates to a method and a battery management system for smoothing power limit when charging or discharging a battery.

The present application claims priority to Korean Patent Application No. 10-2018-0015140 filed in the Republic of Korea on Feb. 7, 2018, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

To safely use a battery, it is necessary to determine the power limit of the battery separately for the charging process and the discharging process, and perform controls based on the determined power limit. To determine the power limit of the battery, it is necessary to predict the terminal voltage of the battery in advance.

However, because in some instances, the battery works in an environment in which the terminal voltage and the current fluctuate so much, it is not easy to predict how much the terminal voltage of the battery will be in a predetermined time from the current time. Additionally, even though the terminal voltage of the battery can be predicted very accurately, if the current of the battery continues to change sharply, the power limit of the battery updated periodically from the terminal voltage and the current of the battery also shows a significant change. When the periodically updated power limit changes sharply, a battery management system cannot properly control the charging/discharging of the battery.

DISCLOSURE

Technical Problem

The present disclosure is designed to solve the above-described problem, and therefore the present disclosure is directed to providing a method and a battery management system for smoothing the charge power limit of a battery that is updated periodically.

The present disclosure is further directed to providing a method and a battery management system for smoothing the discharge power limit of a battery that is updated periodically.

These and other objects and advantages of the present disclosure can be understood by the following description and will be apparent from the embodiments of the present disclosure. Further, it will be readily understood that the objects and advantages of the present disclosure can be realized by the means set forth in the appended claims and combinations thereof.

Technical Solution

A method for smoothing a charge power limit of a battery according to an aspect of the present disclosure includes measuring a terminal voltage and a current of the battery, determining an instantaneous power of the battery based on the measured terminal voltage and the measured current, determining a charge current limit and a charge voltage limit of the battery, determining a charge power limit of the battery based on the charge current limit and the charge voltage limit, determining a first weighting factor based on a given maximum charge voltage and the measured terminal voltage, determining a second weighting factor based on a previous smoothed charge power limit, the charge power limit and the instantaneous power, setting a smaller one of the first weighting factor and the second weighting factor as a first reference weighting factor, smoothing the charge power limit based on the previous smoothed charge power limit and the first reference weighting factor, and transmitting a notification signal indicating the smoothed charge power limit to an external device.

The step of determining the first weighting factor may include determining a first voltage difference by subtracting the measured terminal voltage from the maximum charge voltage, determining a first delay time associated with the first voltage difference from a given first lookup table defining a correlation between a voltage difference in a charging direction and a delay time, and determining the first weighting factor based on the first delay time.

The step of determining the first weighting factor may use the following Equation 1, $$W_{v\_c} = \frac{T_{v\_c\_s}}{T_{v\_c\_s} + T_{v\_c\_r}} \qquad \langle \text{Equation 1} \rangle$$

wherein $T_{v\_c\_s}$ is the first delay time, $T_{v\_c\_r}$ is a given first reference time, and $W_{v\_c}$ is the first weighting factor.

The step of determining the second weighting factor may include determining a first power difference by subtracting the instantaneous power from the previous smoothed charge power limit, determining a first power ratio indicating a relative size of the first power difference to the previous smoothed charge power limit, determining a second delay time associated with the first power ratio from a given second lookup table defining a correlation between a power difference and a delay time, and determining the second weighting factor based on the second delay time.

The step of determining the second weighting factor may use the following Equation 2, $$W_{p\_c} = \frac{T_{p\_c\_s}}{T_{p\_c\_s} + T_{p\_c\_r}} \qquad \langle \text{Equation 2} \rangle$$

wherein $T_{p\_c\_s}$ is the second delay time, $T_{p\_c\_r}$ is a given second reference time, and $W_{p\_c}$ is the second weighting factor.

The step of smoothing the charge power limit may use the following Equation 3, $$P_{s\_c} = W_{LPF\_c} P_{s\_c\_pre} + \{1 - W_{LPF\_c}\} P_{raw\_c} \qquad \langle \text{Equation 3} \rangle$$

wherein $W_{LPF\_c}$ is the first reference weighting factor, $P_{s\_c\_pre}$ is the previous smoothed charge power limit, $P_{raw\_c}$ is the charge power limit, and $P_{s\_c}$ is the smoothed charge power limit.

A method for smoothing a discharge power limit of a battery according to another aspect of the present disclosure includes measuring a terminal voltage and a current of the battery, determining an instantaneous power of the battery based on the measured terminal voltage and the measured current, determining a discharge current limit and a discharge voltage limit of the battery, determining a discharge power limit of the battery based on the discharge current limit and the discharge voltage limit, determining a third weighting factor based on a given minimum discharge voltage and the measured terminal voltage, determining a fourth weighting factor based on a previous smoothed discharge power limit, the discharge power limit and the instantaneous power, setting a smaller one of the third weighting factor and the fourth weighting factor as a second reference weighting factor, smoothing the discharge power limit based on the previous smoothed discharge power limit and the second reference weighting factor, and transmitting a notification signal indicating the smoothed discharge power limit to an external device.

The step of determining the third weighting factor may include determining a second voltage difference by subtracting the measured terminal voltage from the minimum discharge voltage, determining a third delay time associated with the second voltage difference from a given third lookup table defining a correlation between a voltage difference in a discharging direction and a delay time, and determining the third weighting factor based on the third delay time.

The step of determining the fourth weighting factor may include determining a second power difference by subtracting the instantaneous power from the previous smoothed discharge power limit, determining a second power ratio indicating a relative size of the second power difference to the previous smoothed discharge power limit, determining a fourth delay time associated with the second power ratio from a given fourth lookup table defining a correlation between a power ratio and a delay time, and determining the fourth weighting factor based on the fourth delay time.

The step of smoothing the discharge power limit may use the following Equation 4, $$P_{s\_d} = W_{LPF\_d} P_{s\_d\_pre} + \{1 - W_{LPF\_d}\} P_{raw\_d}$$ <Equation 4> wherein $W_{LPF\_d}$ is the second reference weighting factor, $P_{s\_d\_pre}$ is the previous smoothed discharge power limit, $P_{raw\_d}$ is the discharge power limit, and $P_{s\_d}$ is the smoothed discharge power limit.

A battery management system for smoothing a charge power limit of a battery according to still another aspect of the present disclosure includes a sensing unit which measures a terminal voltage and a current of the battery, and a control unit operably coupled to the sensing unit. The control unit is configured to determine an instantaneous power of the battery based on the measured terminal voltage and the measured current. The control unit is configured to determine a charge current limit and a charge voltage limit of the battery. The control unit is configured to determine a charge power limit of the battery based on the charge current limit and the charge voltage limit. The control unit is configured to determine a first weighting factor based on a given maximum charge voltage and the measured terminal voltage. The control unit is configured to determine a second weighting factor based on a previous smoothed charge power limit, the charge power limit and the instantaneous power. The control unit is configured to set a smaller one of the first weighting factor and the second weighting factor as a first reference weighting factor. The control unit is configured to smooth the charge power limit based on the previous smoothed charge power limit and the first reference weighting factor. The control unit is configured to transmit a notification signal indicating the smoothed charge power limit to an external device.

A battery management system for smoothing a discharge power limit of a battery according to yet another aspect of the present disclosure includes a sensing unit which measures a terminal voltage and a current of the battery, and a control unit operably coupled to the sensing unit. The control unit is configured to determine an instantaneous power of the battery based on the measured terminal voltage and the measured current. The control unit is configured to determine a discharge current limit and a discharge voltage limit of the battery. The control unit is configured to determine a discharge power limit of the battery based on the discharge current limit and the discharge voltage limit. The control unit is configured to determine a third weighting factor based on a given minimum discharge voltage and the measured terminal voltage. The control unit is configured to determine a fourth weighting factor based on a previous smoothed discharge power limit, the discharge power limit and the instantaneous power. The control unit is configured to set a smaller one of the third weighting factor and the fourth weighting factor as a second reference weighting factor. The control unit is configured to smooth the discharge power limit based on the previous smoothed discharge power limit and the second reference weighting factor. The control unit is configured to transmit a notification signal indicating the smoothed discharge power limit to an external device.

Advantageous Effects

According to at least one of the embodiments of the present disclosure, it is possible to smooth the charge power limit of the battery that is updated periodically.

Additionally, according to at least one of the embodiments of the present disclosure, it is possible to smooth the discharge power limit of the battery that is updated periodically.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

MODE FOR DISCLOSURE

Figure 1:
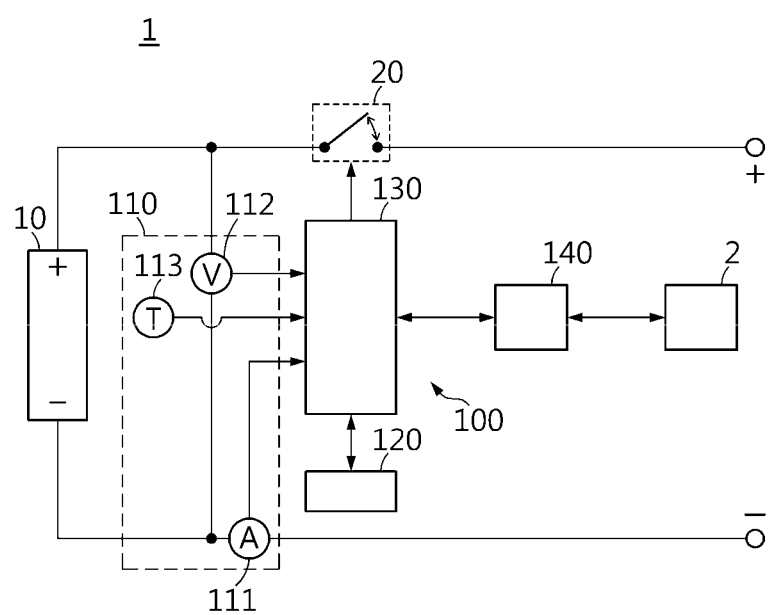
FIG. 1 is a diagram showing the functional configuration of a battery pack according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

FIG. 1 is a diagram showing the functional configuration of a battery pack 1 according to an embodiment of the present disclosure.

Referring to FIG. 1, the battery pack 1 includes a battery 10, a switch 20 and a battery management system 100. The switch 20 is configured to adjust the magnitude of charge current and/or discharge current of the battery 10 in response to a switching signal (for example, a pulse width modulation signal) from the battery management system 100.

The battery management system 100 is electrically coupled to the battery 10 and configured to monitor and control the state of the battery 10. The battery management system 100 includes a sensing unit 110, a memory 120, a control unit 130 and a communication interface 140.

The sensing unit 110 includes a current measuring unit 111. The current measuring unit 111 measures the current of the battery 10 at each time step defined by a predefined length of time, and transmits a current signal indicating the measured current to the control unit 130. The current at the time of discharging the battery 10 may be referred to as 'discharge current', and the current at the time of charging the battery 10 may be referred to as 'charge current'. The control unit 130 may convert the current signal in analog form transmitted from the current measuring unit 111 to current data in digital form. Hereinafter, assume that the current at the time of charging is measured as a positive value, and the current at the time of discharging is measured as a negative value.

The sensing unit 110 may further include a voltage measuring unit 112. The voltage measuring unit 112 measures the terminal voltage of the battery 10 at each time step, and transmits a voltage signal indicating the measured terminal voltage to the control unit 130. The control unit 130 may convert the voltage signal in analog form transmitted from the voltage measuring unit 112 to voltage data in digital form.

The sensing unit 110 may further include a temperature measuring unit 113. The temperature measuring unit 113 measures the temperature of the battery 10 at each time step, and transmits a temperature signal indicating the measured temperature to the control unit 130. The control unit 130 may convert the temperature signal in analog form transmitted from the temperature measuring unit 113 to temperature data in digital form. The current measuring unit 111, the voltage measuring unit 112 and the temperature measuring unit 113 may operate in time synchronization with each other. Hereinafter, $k^{th}$ time step is expressed as 'time step k'. Additionally, the terminal voltage and the current measured by the sensing unit 110 at the time step k are respectively expressed as $V(k)$ and $I(k)$.

The memory 120 may additionally store data, instructions and software required for the overall operation of the battery management system 100. The memory 120 may store data indicating the result of the operation performed by the control unit 130. The terminal voltage, the current and/or the temperature of the battery 10 measured by the sensing unit 110 at each time step may be recorded in the memory 120 in a sequential order. The memory 120 may include at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The control unit 130 is operably coupled to the sensing unit 110, the memory 120 and the communication interface 140. The control unit 130 records the terminal voltage, the current and/or the temperature of the battery 10 measured by the sensing unit 110 at each time step in the memory 120 in a sequential order. The control unit 130 may move, at each time step, a sliding time window having a predefined size as much as a time interval Δt of the time step, and read a plurality of terminal voltages and a plurality of currents measured in the sliding time window among all terminal voltages and currents recorded in the memory 120 from the memory 120. For example, when the time interval of the time step is 0.01 sec, and the size of the sliding time window is 10 sec, 1000 terminal voltages and 1000 currents may be read from the memory 120 at each time step.

The control unit 130 may be physically implemented using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The communication interface 140 may be coupled to an external device 2 such as an electronic control unit (ECU) of an electric vehicle to enable communication between. The communication interface 140 may receive a command message from the external device 2, and provide the received command message to the control unit 130. The command message may be a message that requests the activation of a specific function of the apparatus. The communication interface 140 may transmit a notification message from the control unit 130 to the external device 2. The notification message may be a message for informing the external device 2 of the result of the function (for example, the state of charge of the battery) performed by the control unit 130.

Figure 2:
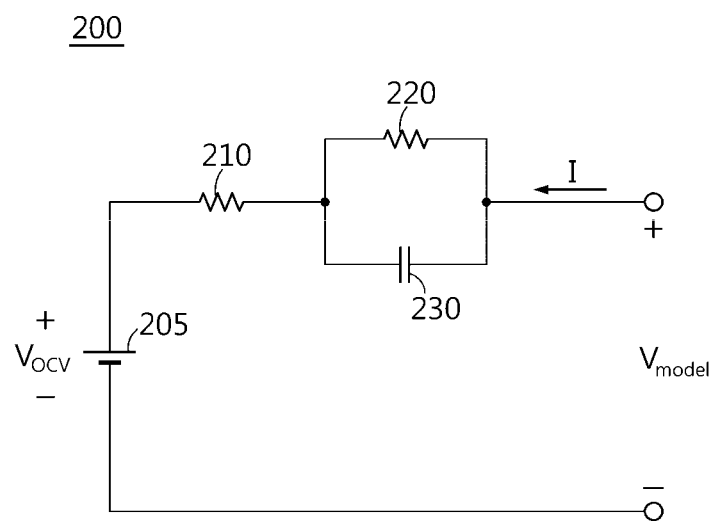
FIG. 2 is a diagram showing an exemplary equivalent circuit model for a battery.

FIG. 2 is a diagram showing an exemplary equivalent circuit model 200 for the battery.

Referring to FIG. 2, the equivalent circuit model 200 may include a voltage source 205, a first resistor 210, a second resistor 220 and a capacitor 230. The parameters of the equivalent circuit model 200 may include the resistance of the first resistor 210, the resistance of the second resistor 220 and the capacitance of the capacitor 230.

The voltage source 205 represents an open circuit voltage (OCV) $V_{OCV}$ of the battery determined from the State Of Charge (SOC) and the temperature of the battery. That is, the OCV $V_{OCV}$ may be uniquely determined when the SOC and the temperature are determined. The OCV $V_{OCV}$ may be predefined for each SOC and each temperature. That is, an OCV-SOC map defining a correlation between the SOC, the temperature and the OCV of the battery may be pre-stored in the memory 110. The OCV at $k^{th}$ time step may be expressed as $V_{OCV}(k)$.

The first resistor 210 models short-term voltage fluctuations by the current flowing through the battery. The terminal voltage measured at the time of charging the battery is higher than the OCV due to the internal resistance of the battery 10. On the contrary, the terminal voltage measured at the time of discharging the battery is lower than the OCV.

The second resistor 220 and the capacitor 230 are connected to each other in parallel. As shown, the second resistor 220 may be connected in series to the first resistor 210. A parallel connection circuit of the second resistor 220 and the capacitor 230 may be referred to as an 'RC pair'. As opposed to the first resistor 210, the second resistor 220 is connected in parallel to the capacitor 230. Accordingly, the RC pair may model the polarization voltage generated during charging or discharging of the battery. That is, the parallel combination of the second resistor 220 and the capacitor 230 is for modeling the transient response history of the battery.

Assume that the resistance of the first resistor 210 and the resistance of the second resistor 220 are constant as $R_1$ and $R_2$, respectively. If Δt is very small, each of the terminal voltage and the current of the battery 10 measured at an arbitrary time step may be constant until the next time step, therefore the OCV of the voltage source 205 may be also handled as being constant between two adjacent time steps.

Assume that the polarization voltage by the RC pair at an arbitrary time point at which the time step k starts is $V_{pola}$, and the resistance of the first resistor 210 and the resistance of the second resistor 220 are constant as $R_1$ and $R_2$, respectively, from the time step k to the time step q. Then, voltage $V_{model}(q)$ of the equivalent circuit model 200 at the time step q may be expressed as the following Equation 1.

$$V_{model}(q) = V_{ocv}(q) + R_1 I(q) + V_{pola} \exp^{-\frac{(q-k)\Delta t}{\tau}} + \sum_{i=1}^{q-k} R_2 I(i+k)\left\{\exp^{-\frac{((q-k)-i)\Delta t}{\tau}} - \exp^{-\frac{((q-k)-i+1)\Delta t}{\tau}}\right\} \quad \text{<Equation 1>}$$

τ is a preset time constant of the RC pair.

Figure 3:
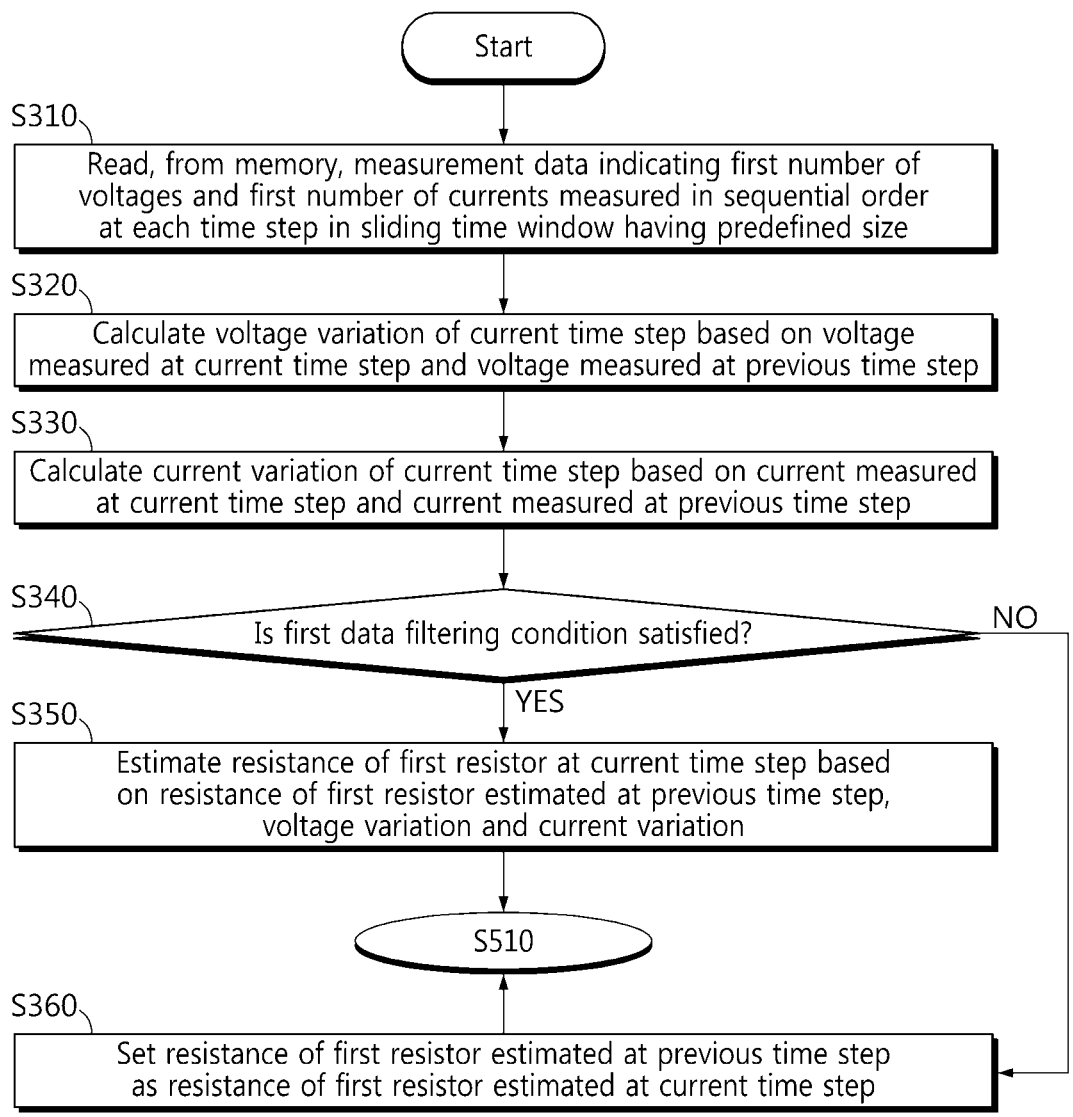
FIG. 3 is a flowchart showing a method for estimating the resistance of a first resistor as one of parameters of an equivalent circuit model according to an embodiment of the present disclosure.
Figure 4:
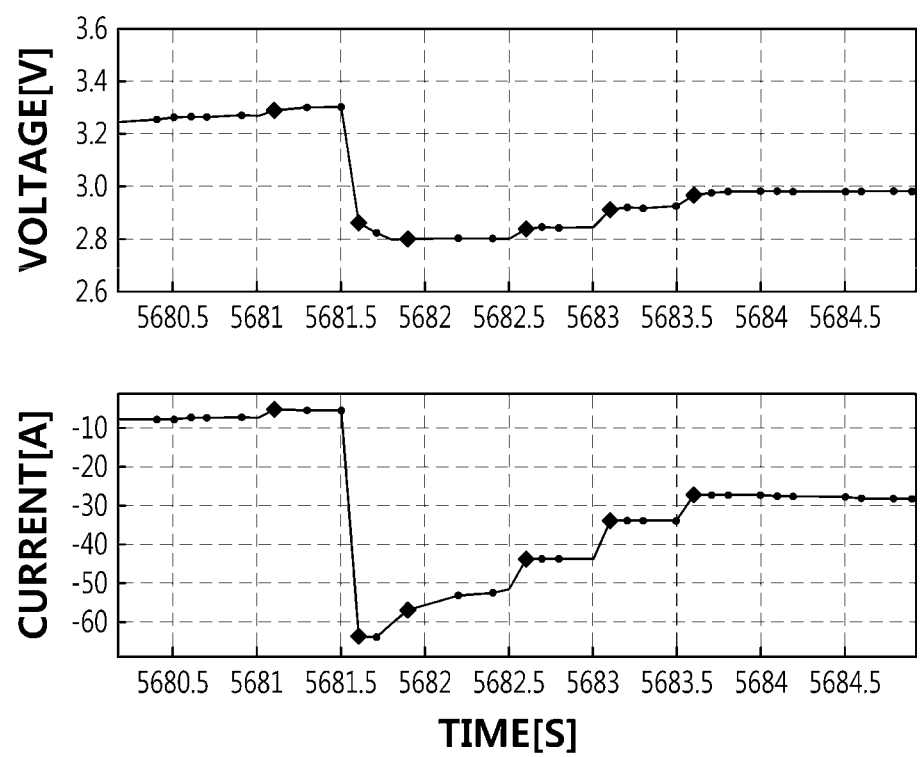
FIG. 4 shows graphs for reference in describing the method of FIG. 3.

FIG. 3 is a flowchart showing a method for estimating the resistance of the first resistor 210 as one of parameters of the equivalent circuit model 200 according to an embodiment of the present disclosure, and FIG. 4 shows graphs for reference in describing the method of FIG. 3.

In step S310, the control unit 130 reads, from the memory 120, measurement data indicating a first number of terminal voltages and a first number of currents measured by the sensing unit 110 in a sequential order at each time step in a sliding time window having a predefined size. That is, the control unit 130 reads, from the memory 120, the first number of terminal voltages and the first number of currents recorded in the memory 120 over a predefined time in the past from the current time step using the sliding time window of which the end time point has moved to the current time step. The predefined time is equal to the size of the sliding time window. The first number is set by the predefined time and the time interval Δt between each time step. For example, when the predefined time=10 sec and Δt=0.01 sec, the first number=10 sec/0.01 sec=1000. Each time the sliding time window moves by Δt, an oldest one of the first number of terminal voltages is discarded, and a newly measured terminal voltage is added. Likewise, each time the sliding time window moves by Δt, an oldest one of the first number of currents is discarded, and a newly measured current is added.

The first number of terminal voltages include terminal voltage V(n) measured at the current time step and terminal voltage V(n−1) measured at the previous time step. The first number of currents include current I(n) measured at the current time step and current I(n−1) measured at the previous time step.

In step S320, the control unit 130 calculates a voltage variation ΔV(n) of the current time step based on the terminal voltage V(n) measured at the current time step and the terminal voltage V(n−1) measured at the previous time step. In this instance, the control unit 130 may calculate the voltage variation ΔV(n) by subtracting the terminal voltage V(n−1) measured at the previous time step from the terminal voltage V(n) measured at the current time step. That is, ΔV(n)=V(n)−V(n−1).

In step S330, the control unit 130 calculates a current variation ΔI(n) of the current time step based on the current I(n) measured at the current time step and the current I(n−1) measured at the previous time step. In this instance, the control unit 130 may calculate the current variation ΔI(n) by subtracting I(n−1) measured at the previous time step from I(n) measured at the current time step. That is, ΔI(n)=I(n)−I(n−1).

Dissimilar to that of FIG. 3, the step S330 may be performed earlier than the step S320, or at the same time as the step S320.

In step S340, the control unit 130 determines whether the voltage variation ΔV(n) and the current variation ΔI(n) satisfy a first data filtering condition. The first data filtering condition is a criterion for determination as to whether ΔV(n) and ΔI(n) are suitable as learning data for estimating the resistance of the first resistor 210.

When (i) the absolute value of the current variation ΔI(n) is larger than a first threshold, and (ii) the multiplication of the voltage variation ΔV(n) and the current variation ΔI(n) is larger than 0, the control unit 130 may determine that the first data filtering condition is satisfied.

The first threshold is a real number greater than 0, and is preset on the basis of a measurement error of the current measuring unit 111. The first resistor 210 is for modeling instantaneous voltage fluctuations formed due to the internal resistance of the battery 10, therefore when the absolute value of ΔI(n) is larger than the first threshold, it is suitable to use ΔI(n) to estimate the resistance of the first resistor 210 at the current time step. In contrast, when the absolute value of ΔI(n) is equal to or less than the first threshold, it is highly likely that ΔI(n) results from the measurement error of the current measuring unit 111, and thus it is unsuitable to use ΔI(n) to estimate the resistance of the first resistor 210 at the current time step.

Additionally, according to the Ohm's law, the voltage of the first resistor 210 is proportional to the current flowing through the first resistor 210. Accordingly, only when ΔV(n) and ΔI(n) have the same sign, it is suitable to use ΔV(n) and ΔI(n) to estimate the resistance of the first resistor 210 at the current time step. In contrast, ΔV(n) having a positive value and ΔI(n) having a negative value or V(n) having a negative value and ΔI(n) having a positive value signify that a voltage change of the first resistor 210 is against the Ohm's law, and thus it is unsuitable to use ΔI(n) to estimate the resistance of the first resistor 210 at the current time step. Each of the two graphs shown in FIG. 4 shows a change in voltage and current of the battery 10 in the same time range. In FIG. 4, the voltage and the current satisfying the first data filtering condition are each marked by a bold dot.

When the value of the step S340 is "YES", the method moves to step S350. On the contrary, when the value of the step S340 is "NO", the method moves to step S360.

In step S350, the control unit 130 estimates the resistance of the first resistor 210 at the current time step based on the resistance $R_{1\_est}(n-1)$ of the first resistor 210 estimated at the previous time step, the voltage variation ΔV(n) and the current variation ΔI(n).

The control unit 130 may estimate the resistance of the first resistor 210 at the current time step using the recursive least square (RLS) algorithm, and a detailed description will be provided below.

First, the weighted sum of squared errors S1 related to resistance estimation of the first resistor 210 may be expressed as the following Equation 2.

$$S1 = \sum_{k=1}^{n} \lambda^{n-k}\{\Delta(k) - R_{1\_est}(n)\Delta I(k)\}^2 \qquad \text{<Equation 2>}$$

In Equation 2, $R_{1\_est}(n)$ is the resistance of the first resistor 210 to be estimated. Additionally, in Equation 2, λ is a first forgetting factor which is preset as being greater than 0 and smaller than 1. λ will give a smaller influence on the resistance estimation of the first resistor 210 as the terminal voltage and the current are measured at an earlier time in the past from the current time step.

The solution of the weighted sum of squared errors S1, i.e., $R_{1\_est}(n)$ to minimize S1, may be calculated by the following Equations 3 and 4.

$$P_1(n) = \frac{1}{\lambda}\left\{P_1(n-1) - \frac{P_1(n-1)^2 \Delta I(n)^2}{\lambda + P_1(n-1)\Delta I(n)^2}\right\} \qquad \text{<Equation 3>}$$

$$R_{1\_est}(n) = \qquad \text{<Equation 4>}$$
$$R_{1\_est}(n-1) + P_1(n)\Delta I(n)\{\Delta V(n) - R_{1\_est}(n-1)\Delta I(n)\}$$

$P_1(n)$ and $P_1(n-1)$ are a correction factor of the current time step and a correction factor of the previous time step, respectively. That is, $P_1(n-1)$ is updated to $P_1(n)$ by Equation 4.

In Equation 4, $R_{1\_est}(n-1)$ is the pre-estimated resistance of the first resistor 210 at the previous time step. The control unit 130 may calculate the estimated resistance $R_{1\_est}(n)$ of the first resistor 210 at the current time step using Equation 3 and Equation 4.

For the case in which a value of the symbol n indicating the current time step becomes 1 due to the initialization of the battery management system 100, $P_1(0)$ and $R_{1\_est}(0)$ may be pre-stored in the memory 120 as different initial values. For example, $P_1(0)=(1-\lambda)/(TH_1)^2$, and $TH_1$ may be equal to the first threshold. Additionally, $R_{1\_est}(0)$ may be a preset value corresponding to the temperature of the battery 10 measured at the initial time step. The control unit 130 stores the estimated resistance $R_{1\_est}(n)$ of the first resistor 210 at the current time step in the memory 120.

In step S360, the control unit 130 sets the resistance $R_{1\_est}(n-1)$ of the first resistor 210 estimated at the previous time step as the resistance $R_{1\_est}(n)$ of the first resistor 210 estimated at the current time step. That is, the resistance of the first resistor at the current time step is handled as being equal to the resistance $R_{1\_est}(n-1)$ of the first resistor 210 estimated at the previous time step. Accordingly, dissimilar to S350, $R_{1\_est}(n)=R_{1\_est}(n-1)$.

Figure 5:
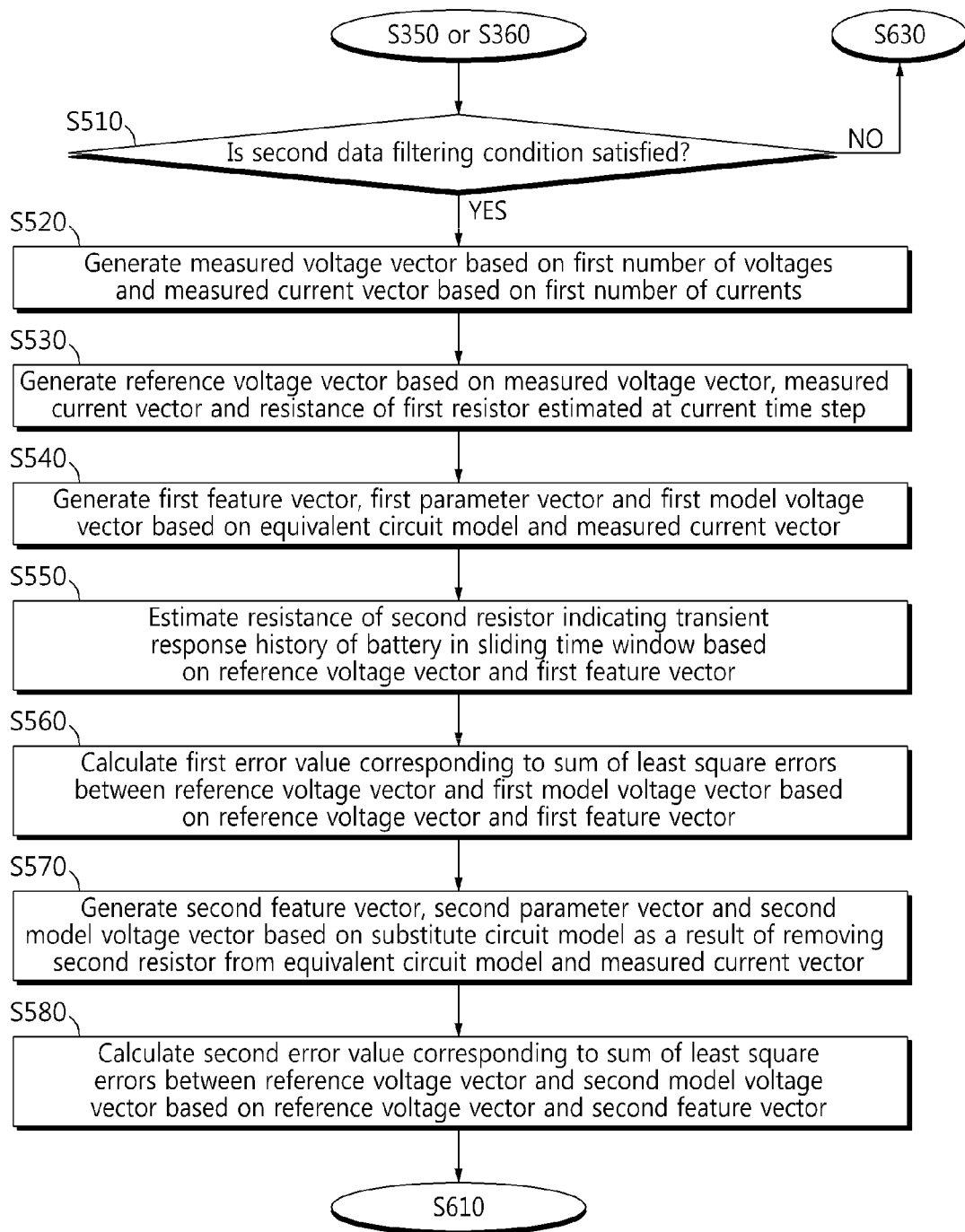
FIGS. 5 and 6 are flowcharts showing a method for estimating the resistance of a second resistor as one of parameters of an equivalent circuit model according to an embodiment of the present disclosure.
Figure 6:
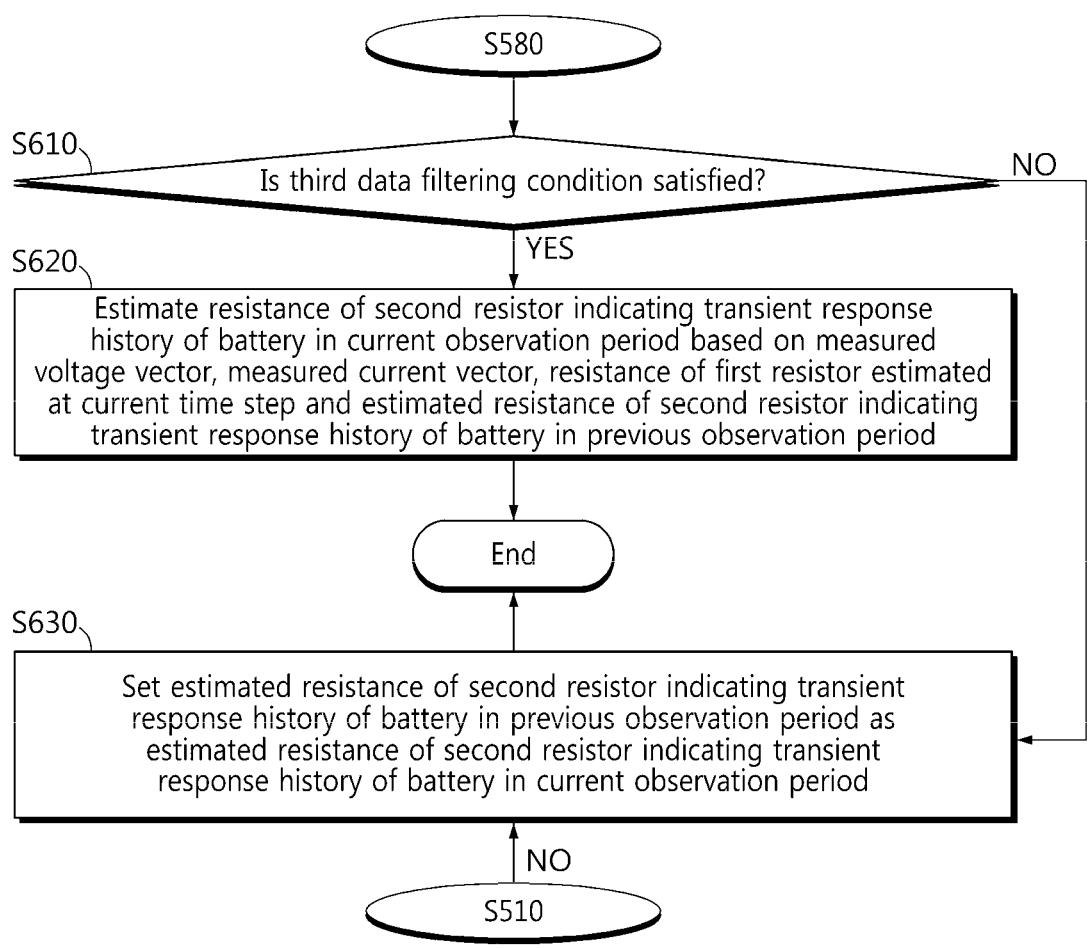
Figure 7:
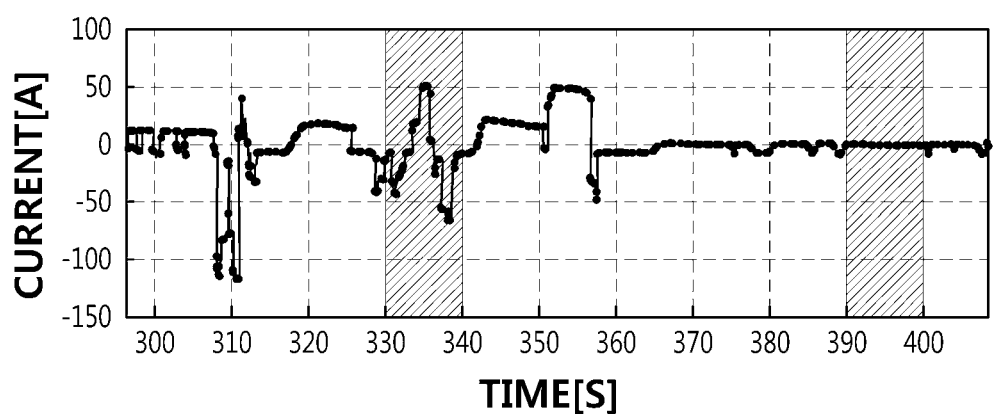
FIG. 7 shows a graph for reference in describing the method of FIG. 5.

FIGS. 5 and 6 are flowcharts showing a method for estimating the resistance of the second resistor 220 as another one of parameters of the equivalent circuit model 200 according to an embodiment of the present disclosure, and FIG. 7 shows a graph for reference in describing the method of FIG. 5.

In step S510, the control unit 130 determines whether the first number of currents satisfy a second data filtering condition. The second data filtering condition is a criterion for determination as to whether the first number of terminal voltages and the first number of currents are suitable as learning data for estimating the resistance of the second resistor 220.

When a difference between the maximum and the minimum of the first number of currents is larger than a second threshold, the control unit 130 may determine that the second data filtering condition is satisfied. The graph shown in FIG. 7 shows a change in the current of the battery 10 measured for a longer time than the size of the sliding time window. Assume that the size of the sliding time window is 10 sec, and the second threshold is 10 A. Seeing FIG. 7, a difference between the maximum and the minimum of the current measured from 330 sec to 340 sec is 100 A or above. Accordingly, the current measured from 330 sec to 340 sec satisfies the second data filtering condition. In contrast, the current measured from 390 sec to 400 sec is constant, and does not satisfy the second data filtering condition.

Due to the capacitor 230, the voltage of the second resistor 220 changes more slowly than the voltage of the first resistor 210. Accordingly, it is preferred that the second threshold is larger than the first threshold.

When the value of the step S510 is "YES", step S520 is performed. When the value of the step S510 is "NO", step S630 is performed.

In step S520, the control unit 130 generates a measured voltage vector based on the first number of terminal voltages and a measured current vector based on the first number of currents. Hereinafter, assume that the first number is m of 2 or greater. Those skilled in the art will understand that n indicating the order of the current time step is larger than m.

The measured voltage vector may be expressed as m×1 matrix as below.

$$V_{vec} = [V(n-m+1)\,V(n-m+2)\,V(n-m+3) \ldots V(n)]^T$$

The measured current vector may be expressed as m×1 matrix as below.

$$I_{vec} = [I(n-m+1)\,I(n-m+2)\,I(n-m+3) \ldots I(n)]^T$$

In the above, the symbol T indicates the transposed matrix.

In step S530, the control unit 130 generates a reference voltage vector based on the measured voltage vector, the measured current vector and the resistance $R_{1\_est}(n)$ of the first resistor 210 estimated at the current time step. $R_{1\_est}(n)$ indicates the internal resistance of the battery 10, and assume that $R_{1\_est}(n)$ is constant in the sliding time window. Then, the reference voltage vector may be expressed as below.

$$Y_{w\_vec} = V_{vec} - R_{1\_est}(n)I_{vec}$$

The reference voltage vector $Y_{w\_vec}$ indicates a result of subtracting the voltage of the internal resistance by each of the first number of currents from each of the first number of terminal voltages.

In step S540, the control unit 130 may generate a first feature vector, a first parameter vector and a first model voltage vector based on the equivalent circuit model 200 and the measured current vector. The first model voltage vector is the multiplication of the first feature vector and the first parameter vector.

Let us r, $K_{vec}$, $H_{ind\_vec}$ and $1_{vec}$ be each defined as below.

$$r = \exp\left(-\frac{\Delta t}{\tau}\right)$$

$$K_{vec} = [r\ r^2\ r^3\ \cdots\ r^m]^T$$

$$H_{ind\_vec} = (1-r)\begin{bmatrix} 1 & 0 & 0 & \cdots & 0 \\ r & 1 & 0 & \cdots & 0 \\ r^2 & r & 1 & \cdots & 0 \\ \vdots & \vdots & \vdots & \ddots & \vdots \\ r^{m-1} & r^{m-2} & r^{m-3} & \cdots & 1 \end{bmatrix} I_{vec}$$

$$1_{vec} = [1\ 1\ 1\ \cdots\ 1]^T$$

In case that the OCV of the voltage source 205 is constant as $V_{ocv}$ in the sliding time window, when the above definition is applied to Equation 1, the first model voltage vector expressed as the following Equation 5 may be derived.

$$V_{model1\_vec} = V_{ocv} 1_{vec} + R_2 H_{ind\_vec} + V_{pola} K_{vec} = [1_{vec} H_{ind\_vec} K_{vec}][V_{ocv} R_2 V_{pola}]^T \quad \text{<Equation 5>}$$

In Equation 5, when $X_{1\_vec} = [1_{vec}\ H_{ind\_vec}\ K_{vec}]$, $\beta_{1\_vec} = [V_{ocv}\ R_2\ V_{pola}]^T$, Equation 5 may be simplified as the following Equation 6. The first model voltage vector may be a result of modeling the reference voltage vector.

$$V_{model1\_vec} = X_{1\_vec} \beta_{1\_vec} \quad \text{<Equation 6>}$$

$X_{1\_vec}$ is the first feature vector expressed as m×3 matrix. $\beta_{1\_vec}$ is the first parameter vector expressed as 3×1 matrix, and converts the first feature vector to the first model voltage vector. The three components included in the first parameter vector are all unknown.

In step S550, the control unit 130 estimates the resistance of the second resistor 220 indicating the transient response history of the battery in the sliding time window based on the reference voltage vector and the first feature vector.

The sum of square errors S2 between the reference voltage vector and the first model voltage vector may be expressed as the following Equation 7.

$$S2 = \|Y_{w\_vec} - V_{model1\_vec}\|^2 = \|Y_{w\_vec} - X_{1\_vec} \beta_{1\_vec}\|^2$$

The control unit 130 may estimate the first parameter vector to minimize the sum of square errors S2 using the following Equation 8.

$$\beta_{1\_win} = [V_{ocv\_win} R_{2\_win} V_{pola\_win}]^T = (X_{1\_vec}^T X_{1\_vec})^{-1} X_{1\_vec}^T Y_{w\_vec} \quad \text{<Equation 8>}$$

The transient response history of the battery generated in the sliding time window is defined by the first number of terminal voltages and the first number of currents. Accordingly, the component $R_{2\_win}$ of the first parameter vector estimated using the above Equation 8 is the estimated resistance of the second resistor 220 indicating the transient response history of the battery in the sliding time window.

In step S560, the control unit 130 may calculate a first error value corresponding to the sum of least square errors S3 between the reference voltage vector and the first model voltage vector based on the reference voltage vector and the first feature vector.

The control unit 130 may calculate the sum of least square errors S3 using the following Equation 9 related to the method of least squares.

$$S3 = Y_{w\_vec}^T \{E - X_{1\_vec}(X_{1\_vec}^T X_{1\_vec})^{-1} X_{1\_vec}^T\} Y_{w\_vec} \quad \text{<Equation 9>}$$

In Equation 9, E is the unit matrix.

The first error value may be any one of (i) S3, (ii) the mean of S3, i.e., S3/m, and (iii) the square root of S3/m.

In step S570, the control unit 130 may generate a second feature vector, a second parameter vector and a second model voltage vector based on a substitute circuit model as a result of removing the second resistor 220 from the equivalent circuit model 200 and the measured current vector. The second model voltage vector is the multiplication of the second feature vector and the second parameter vector.

As the substitute circuit model is free of the second resistor 220 of the equivalent circuit model 200, the second parameter vector is expressed as $\beta_{2\_v} = [V_{ocv}\ V_{pola}]^T$ as a result of removing $R_2$ from the first parameter vector, and the second feature vector is expressed as $X_{2\_vec} = [1_v\ k_v]$ as a result of removing $H_{ind\_v}$ from the first feature vector.

Accordingly, the second model voltage vector may be expressed as the following Equation 10.

$$V_{model2\_vec} = X_{2\_vec} \beta_{2\_vec} \qquad \text{<Equation 10>}$$

In step S580, the control unit 130 may calculate a second error value corresponding to the sum of least square errors S4 between the reference voltage vector and the second model voltage vector based on the reference voltage vector and the second feature vector.

The control unit 130 may calculate the sum of least square errors S4 using the following Equation 11 related to the method of least squares.

$$S4 = Y_{w\_vec}^T \{E - X_{2\_vec}(X_{2\_vec}^T X_{2\_vec})^{-1} X_{2\_vec}^T\} Y_{w\_vec} \qquad \text{<Equation 11>}$$

The second error value may be any one of (i) S4, (ii) the mean of S4, i.e., S4/m, and (iii) the square root of S4/m.

In step S610, the control unit 130 determines whether a third data filtering condition is satisfied based on the estimated resistance $R_{2\_win}$ of the second resistor 220 indicating the transient response history of the battery in the sliding time window, the first error value and the second error value.

In detail, in step S610, the control unit 130 determines each of (i) whether $R_{2\_win}$ is larger than 0 ohm, and (ii) whether the second error value is larger than a value obtained by multiplying the first error value by a scaling factor (for example, 1.1) preset to a value greater than 1. That is, the third data filtering condition may be satisfied when $R_{2\_win}$ is larger than 0 ohm and the second error value is larger than a value obtained by multiplying the first error value by the scaling factor.

In the physical aspect, actually, the resistance of the second resistor 220 cannot be 0 ohm or less. Accordingly, $R_{2\_win}$ of 0 ohm or less indicates that the first number of terminal voltages and the first number of currents are unsuitable for resistance estimation of the second resistor 220. Additionally, as described above, the second error value indicates that the polarization voltage by the RC pair is not taken into consideration. Accordingly, the value obtained by multiplying the first error value by the scaling factor being larger than the second error value indicates that the first number of terminal voltages and the first number of currents fail to properly reflect the dynamic characteristics of voltage generated by the second resistor 220.

When the third data filtering condition is satisfied, S620 is performed, and otherwise, S630 is performed.

In step S620, the control unit 130 estimates the resistance of the second resistor 220 indicating the transient response history of the battery in the current observation period based on the measured voltage vector, the measured current vector, the resistance $R_{1\_est}(n)$ of the first resistor 210 estimated at the current time step and the estimated resistance $R_{2\_est}(n-1)$ of the second resistor 220 indicating the transient response history of the battery 10 in the previous observation period. The previous observation period is a period from the initial time step to the previous time step. The current observation period is a period from the initial time step to the current time step.

The control unit 130 may estimate the resistance of the second resistor 220 at the current time step using the following Equation 12 representing a function based on the RLS algorithm.

$$R_{2\_est}(n) = f(R_{1\_est}(n), R_{2\_est}(n-1), V_{vec}, I_{vec}) \qquad \text{<Equation 12>}$$

In Equation 12, the function f( ) outputs $R_{2\_est}(n)$ when $R_{1\_est}(n)$, $R_{1\_est}(n-1)$, $V_{vec}$ and $I_{vec}$ are inputted. $R_{2\_est}(n-1)$ is the estimated resistance of the second resistor 220 indicating the transient response history of the battery in the previous observation period. Likewise, $R_{2\_est}(n)$ is the estimated resistance of the second resistor 220 indicating the transient response history of the battery in the current observation period.

In step S630, the control unit 130 sets the estimated resistance $R_{2\_est}(n-1)$ of the second resistor 220 indicating the transient response history of the battery 10 in the previous observation period as the estimated resistance $R_{2\_est}(n)$ of the second resistor 220 indicating the transient response history of the battery 10 in the current observation period. That is, the transient response history of the battery 10 in the previous observation period is handled as being equal to the transient response history of the battery 10 in the current observation period. Accordingly, dissimilar to S620, $R_{2\_est}(n) = R_{1\_est}(n-1)$.

The control unit 130 may predict the terminal voltage of the battery 10 using the estimated resistance $R_1$ est(n) of the first resistor 210 and the estimated resistance $R_2$ est(n) of the second resistor 220, and adjust the duty cycle of the switching signal outputted to the switch 20 based on the predicted terminal voltage.

The control unit 130 may estimate the SOC of the battery 10 at the current time step using the estimated resistance $R_1$ est(n) of the first resistor 210 and the estimated resistance $R_2$ est(n) of the second resistor 220, and adjust the duty cycle of the switching signal outputted to the switch 20 based on the estimated SOC.

Figure 8:
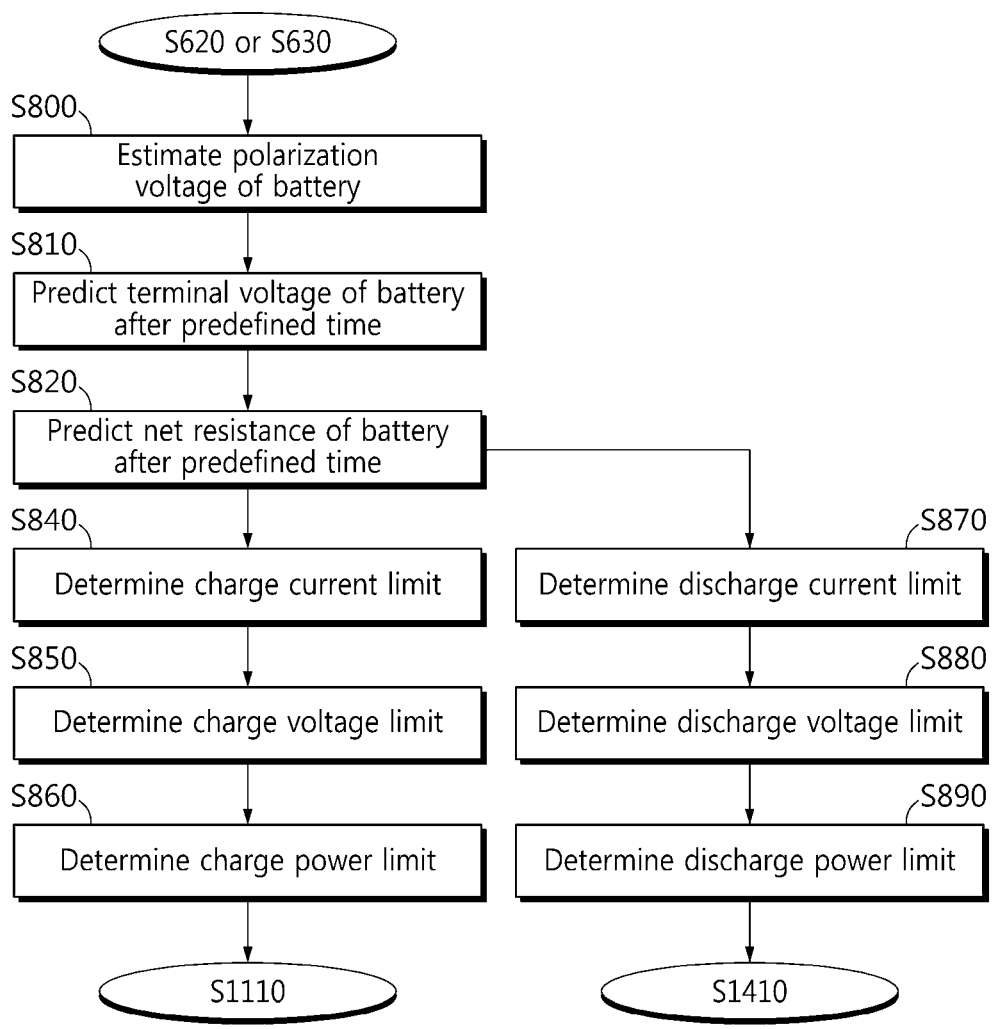
FIG. 8 is a flowchart showing a method for determining the charge power limit and the discharge power limit of a battery according to another embodiment of the present disclosure.
Figure 9:
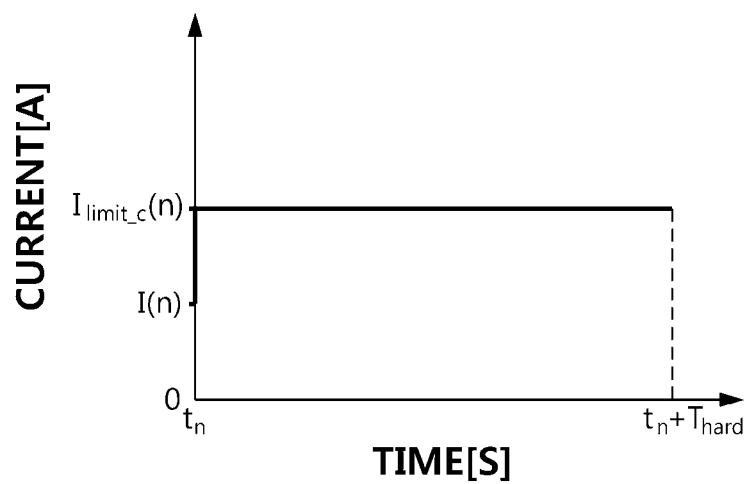
FIGS. 9 and 10 show different exemplary graphs for reference in describing the method of FIG. 8.
Figure 9:
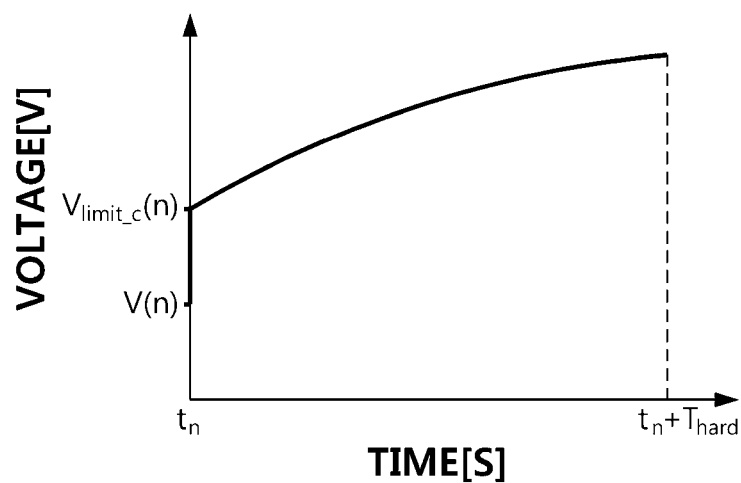
Figure 10:
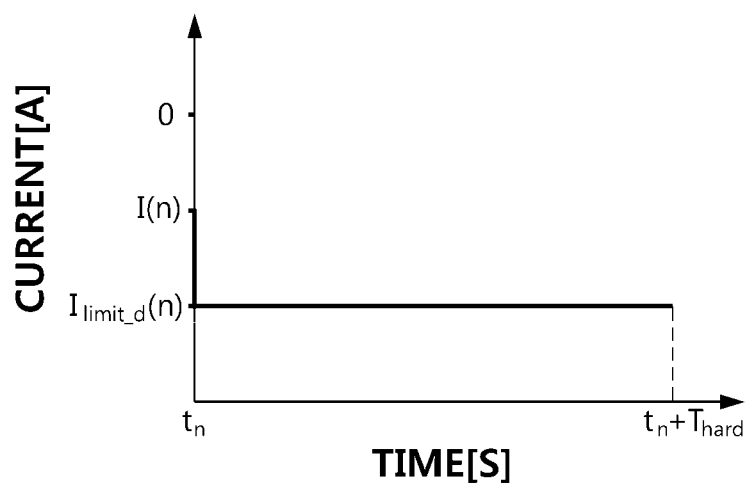
Figure 10:
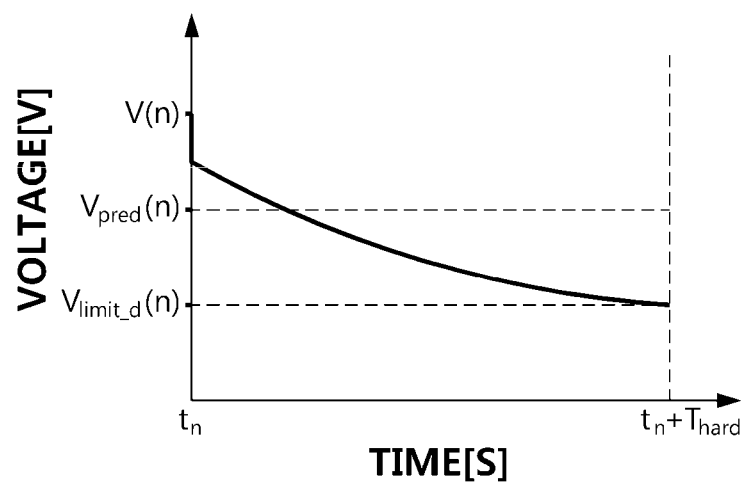

FIG. 8 is a flowchart showing a method for determining the charge power limit and the discharge power limit of the battery 10 according to another embodiment of the present disclosure, and FIGS. 9 and 10 show different exemplary graphs for reference in describing the method of FIG. 8. The method of FIG. 8 starts after the resistance of the first resistor 210 and the resistance of the second resistor 220 are estimated through the method of FIGS. 3, 5 and 6.

Referring to FIG. 8, in step S800, the control unit 130 may estimate the polarization voltage $V_{pola}(n)$ of the battery 10. The polarization voltage $V_{pola}(n)$ may be estimated through a variety of known methods. The control unit 130 may use $V_{pola\_win}$ estimated using Equation 8 in the step S550 of FIG. 5 as the polarization voltage $V_{pola}(n)$, and in this case, the step S800 may be omitted.

In step S810, the control unit 130 predicts the terminal voltage of the battery 10 after a predefined time $T_{hard}$ based on the resistance $R_{2\_est}(n)$ of the second resistor 220, the measured terminal voltage V(n), the measured current I(n) and the polarization voltage $V_{pola}(n)$ of the battery 10.

Assume that the current of the battery 10 is constant as hard for the predefined time $T_{hard}$ from the current time step. $I_{hard}$ may be equal to or larger or smaller than I(n). When it is assumed that the OCV of the battery 10 is constant for the predefined time $T_{hard}$ from the current time step, the terminal voltage $V_t$ of the battery 10 at an arbitrary time point t in the period until the predefined time $T_{hard}$ has passed from the current time step may be expressed as the following Equation 13.

$$V_t = V(n) + \left\{1 + \exp^{-\frac{t-t_n}{\tau}}\right\}\{R_{2\_est}(n)I(n) - V_{pola}(n)\} + \qquad \text{<Equation 13>}$$
$$\left\{R_{1\_est}(n) + \left\{1 - \exp^{-\frac{t-t_n}{\tau}}\right\}R_{2\_est}(n)\right\}\{I_{hard} - I(n)\}$$

$t_n$ is the time point indicating the current time step.

The control unit 130 may calculate the predicted terminal voltage using the following Equation 14. Equation 14 may be derived by substituting I(n) into $I_{hard}$ of Equation 13 and $t_n + T_{hard}$ into t.

$$V_{pred}(n) = V(n) + \left\{1 - \exp^{-\frac{T_{hard}}{\tau}}\right\}(R_{2\_est}(n)I(n) - V_{pola}(n))$$  <Equation 14>

$V_{pred}(n)$ is the predicted terminal voltage.

In step S820, the control unit 130 predicts the net resistance of the battery 10 after the predefined time $T_{hard}$ based on the resistance $R_{1\_est}(n)$ of the first resistor 210 and the resistance $R_{2\_est}(n)$ of the second resistor 220. The control unit 130 may calculate the predicted net resistance using the following Equation 15.

$$R_{net}(n) = R_{1\_est}(n) + \left\{1 - \exp^{-\frac{T_{hard}}{\tau}}\right\}R_{2\_est}(n)$$  <Equation 15>

$R_{net}(n)$ is the predicted net resistance. As described above, $R_{2\_est}(n)$ is larger than 0 ohm, thus $R_{net}(n)$ is larger than $R_{1\_est}(n)$.

In step S840, the control unit 130 determines the charge current limit $I_{limit\_c}(n)$. In detail, the control unit 130 determines the charge current limit $I_{limit\_c}(n)$ based on the measured current I(n), the predicted terminal voltage $V_{pred}(n)$, the predicted net resistance $R_{net}(n)$ and the given maximum charge voltage $V_{max}$. The control unit 130 may determine the charge current limit $I_{limit\_c}(n)$ using the following Equation 16.

$$I_{limit\_c}(n) = I(n) + \frac{V_{max} - V_{pred}(n)}{R_{net}(n)}$$  <Equation 16>

When $I_{limit\_c}(n)$ is larger than the given maximum charge current $I_{max}$, the control unit 130 may determine the charge current limit $I_{limit\_c}(n)$ as a same value as the given maximum charge current $I_{max}$.

In step S850, the control unit 130 determines the charge voltage limit $V_{limit\_c}(n)$. In detail, the control unit 130 determines the charge voltage limit $V_{limit\_c}(n)$ based on the measured terminal voltage V(n), the measured current I(n), the charge current limit $I_{limit\_c}(n)$ and the resistance $R_{1\_est}(n)$ of the first resistor 210. The control unit 130 may determine the charge voltage limit $V_{limit\_c}(n)$ using the following Equation 17.

$$V_{limit\_c}(n) = V(n) + \{I_{limit\_c}(n) - I(n)\}R_{1\_est}(n)$$  <Equation 17>

In Equation 17, $V_{limit\_c}(n)$ is equal to $t=t_n$ and $I_{hard}=I_{limit\_c}(n)$ of Equation 13.

FIG. 9 shows a voltage graph showing a change in terminal voltage of the battery 10 when the current of the battery 10 is constant as $I_{limit\_c}(n)$ from $t_n$ to $t_n+T_{hard}$. That is, the voltage graph of FIG. 9 is obtained by substituting $I_{limit\_c}(n)$ into hard of Equation 13. Referring to FIG. 9, in Equation 17, the use of V(n) and $R_{1\_est}(n)$ in place of $V_{pred}(n)$ and $R_{net}(n)$ is to determine the lowest voltage in the period for the predefined time $T_{hard}$ from the current time step as the charge voltage limit $V_{limit\_c}(n)$.

In step S860, the control unit 130 determines the state of power (SOP) indicating the charge power limit of the battery 10 based on the charge current limit $I_{limit\_c}(n)$ and the charge voltage limit $V_{limit\_c}(n)$. The charge power limit is power that the battery 10 can be supplied for the predefined time $T_{hard}$ from the current time with the charge current limit $I_{limit\_c}(n)$ and the charge voltage limit $V_{limit\_c}(n)$, and is equal to the multiplication of the charge current limit $I_{limit\_c}(n)$ and the charge voltage limit $V_{limit\_c}(n)$.

In step S870, the control unit 130 determines the discharge current limit $I_{limit\_d}(n)$. In detail, the control unit 130 determines the discharge current limit $I_{limit\_d}(n)$ based on the measured current I(n), the predicted terminal voltage $V_{pred}(n)$, the predicted net resistance $R_{net}(n)$ and the given minimum discharge voltage $V_{mim}$. The control unit 130 may determine the discharge current limit $I_{limit\_d}(n)$ using the following Equation 18.

$$I_{limit\_d}(n) = I(n) + \frac{V_{min} - V_{pred}(n)}{R_{net}(n)}$$  <Equation 18>

When $I_{limit\_d}(n)$ is smaller than the given minimum discharge current $I_{mim}$, the control unit 130 may determine the discharge current limit $I_{limit\_d}(n)$ as a same value as the given minimum discharge current $I_{mim}$.

In step S880, the control unit 130 determines the discharge voltage limit $V_{limit\_d}(n)$. In detail, the control unit 130 determines the discharge voltage limit $V_{limit\_d}(n)$ based on the measured terminal voltage V(n), the measured current I(n), the discharge current limit $I_{limit\_d}(n)$ and the resistance $R_{1\_est}(n)$ of the first resistor 210. The control unit 130 may determine the discharge voltage limit $V_{limit\_d}(n)$ using the following Equation 19.

$$V_{limit\_d}(n) = V_{pred}(n) + \{I_{limit\_d}(n) - I(n)\}R_{net}(n)$$  <Equation 19>

In Equation 19, $V_{limit\_d}(n)$ is equal to $t=t_n+I_{hard}$ and $I_{hard}=I_{limit\_d}(n)$ of Equation 13.

FIG. 10 shows a voltage graph showing a change in terminal voltage of the battery 10 when the current of the battery 10 is constant as $I_{limit\_d}(n)$ from the time point to indicating the current time step to $t_n+T_{hard}$. That is, the voltage graph of FIG. 10 is obtained by substituting $I_{limit\_d}(n)$ into hard of Equation 13. Referring to FIG. 10, in contrast with Equation 17, in Equation 19, the use of $V_{pred}(n)$ and $R_{net}(n)$ in place of V(n) and $R_{1\_est}(n)$ is to determine the lowest voltage in the period for the predefined time $T_{hard}$ from the current time step as the discharge voltage limit $V_{limit\_d}(n)$.

In step S890, the control unit 130 determines the SOP indicating the discharge power limit of the battery 10 based on the discharge current limit $I_{limit\_d}(n)$ and the discharge voltage limit $V_{limit\_d}(n)$. The discharge power limit is power that the battery 10 can supply for the predefined time $T_{hard}$ from the current time with the discharge current limit $I_{limit\_d}(n)$ and the discharge voltage limit $V_{limit\_d}(n)$, and is equal to the multiplication of the discharge current limit $I_{limit\_d}(n)$ and the discharge voltage limit $V_{limit\_d}(n)$.

The control unit 130 may transmit a notification signal indicating the charge voltage limit $V_{limit\_c}(n)$ and/or the discharge voltage limit $V_{limit\_d}(n)$ to the external device 2. After the step S890, step S1410 of the method of FIG. 14 as described below may be performed.

Before the start of the method of FIG. 11 or FIG. 14 below, the control unit 130 determines the instantaneous power $P_{inst}$ of the battery 10 based on the measured terminal voltage V(n) and the measured current I(n). $P_{inst}=V(n)I(n)$.

Figure 11:
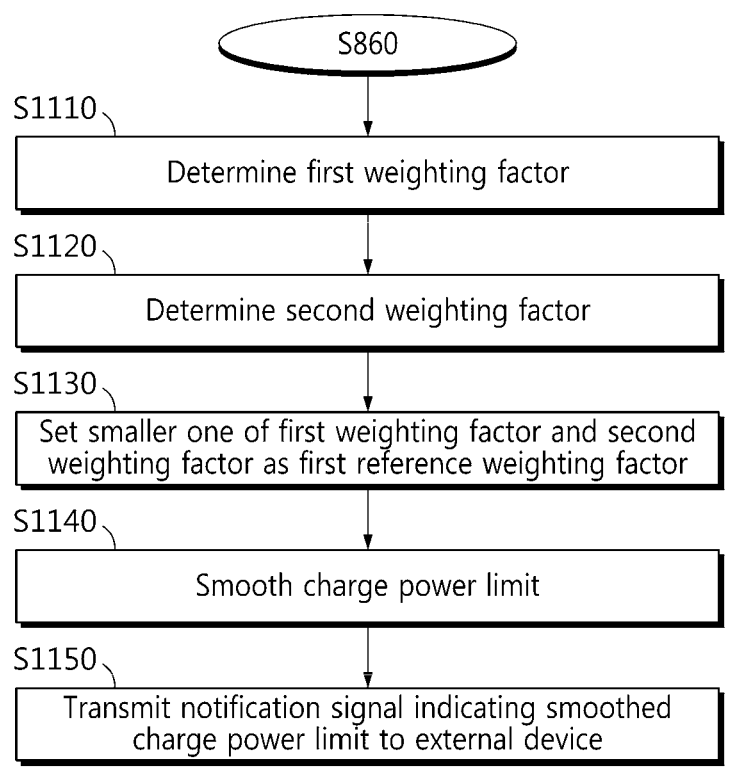
FIG. 11 is a flowchart showing a method for smoothing the charge power limit of a battery according to another embodiment of the present disclosure.
Figure 12:
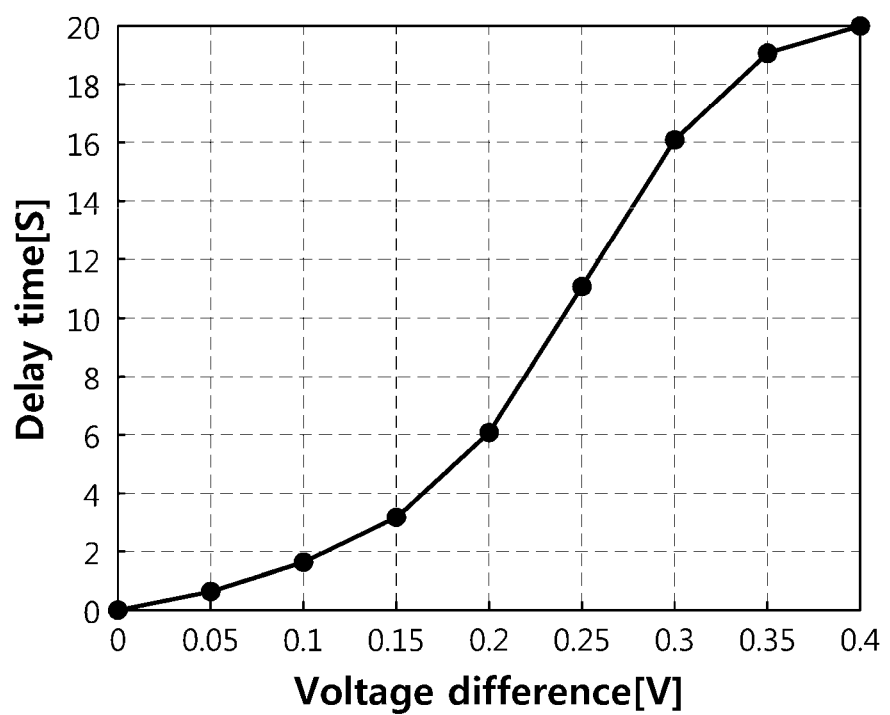
FIGS. 12 and 13 show different exemplary graphs for reference in describing the method of FIG. 11.
Figure 13:
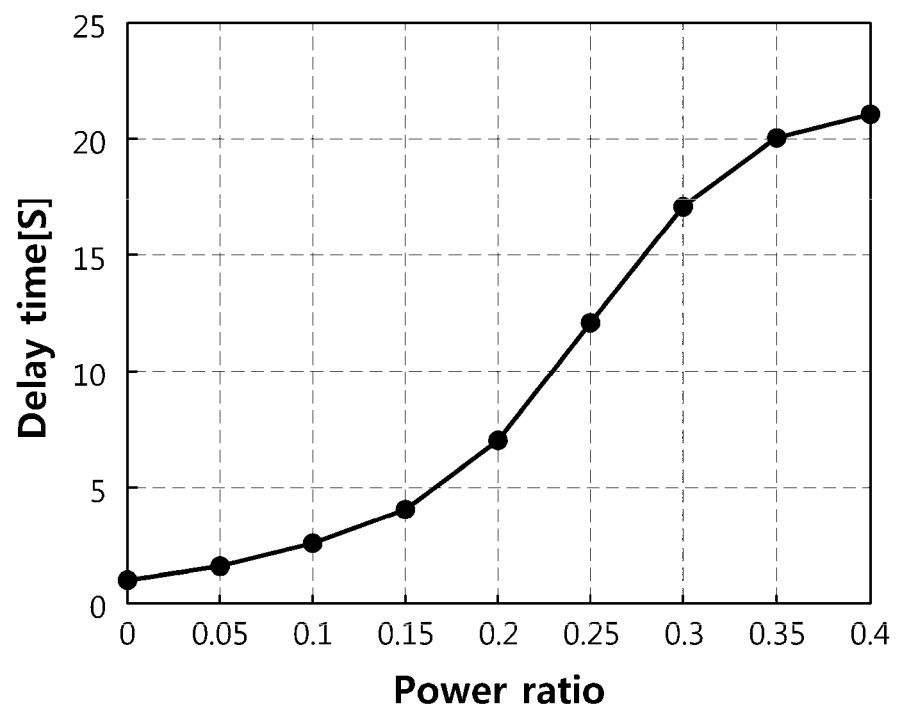

FIG. 11 is a flowchart showing a method for smoothing the charge power limit of the battery 10 according to another embodiment of the present disclosure, and FIGS. 12 and 13 show different exemplary graphs for reference in describing the method of FIG. 11. The method of FIG. 11 starts after the charge power limit at the current time step is determined through the method of FIG. 8.

Referring to FIG. 11, in step S1110, the control unit 130 determines a first weighting factor $W_{v\_c}$ based on the maximum charge voltage $V_{max}$ and the measured terminal voltage V(n). In detail, the control unit 130 determines a first voltage difference $V_{max}$–V(n) by subtracting the measured terminal voltage V(n) from the maximum charge voltage $V_{max}$, and determines a first delay time associated with the first voltage difference from a given first lookup table stored in the memory 120. FIG. 12 is a graph showing a correlation between the voltage difference in the charging direction and the delay time, defined in the first lookup table. As can be seen from the graph of FIG. 12, with the increasing first voltage difference in the charging direction, the first delay time associated with it may increase. For example, when the first voltage difference=0.2V, the first delay time=6 sec, and when the first voltage difference=0.3V, the first delay time=16 sec. When the first voltage difference is equal to or greater than a predetermined value (for example, 0.4V), the control unit 130 may determine a given maximum delay time (for example, 20 sec) as the first delay time. The control unit 130 determines the first weighting factor $W_{v\_c}$ based on the first delay time. The control unit 130 may determine the first weighting factor $W_{v\_c}$ using the following Equation 20.

$$W_{v\_c} = \frac{T_{v\_c\_s}}{T_{v\_c\_s} + T_{v\_c\_r}} \qquad \text{<Equation 20>}$$

$T_{v\_c\_s}$ is the first delay time, and $T_{v\_c\_r}$ is a given first reference time. In Equation 20, it can be seen that $W_{v\_c}$ may be equal to or greater than 0 and less than 1.

In step S1120, the control unit 130 determines a second weighting factor $W_{p\_c}$ based on the previous smoothed charge power limit $P_{s\_c\_pre}$, the charge power limit $P_{raw\_c}$ and the instantaneous power $P_{inst}$. $P_{s\_c\_pre}$ is the charge power limit smoothed latest before the current time step, and may be a value stored in the memory 120. To distinguish from $P_{s\_c\_pre}$, $P_{raw\_c}$ may be referred to as 'current state of charge power'. In detail, the control unit 130 determines a first power difference $P_{s\_c\_pre}$–$P_{inst}$ by subtracting the instantaneous power $P_{inst}$ from the previous smoothed charge power limit $P_{s\_c\_pre}$, and determines a first power ratio indicating a relative size of the first power difference $P_{s\_c\_pre}$–$P_{inst}$ to the previous smoothed charge power limit $P_{s\_c\_pre}$. For example, when $P_{s\_c\_pre}$=10 kW (kilowatt) and $P_{inst}$=8 kW, the first power ratio=(10-8)/10=0.20.

The control unit 130 determines a second delay time associated with the first power ratio from a given second lookup table stored in the memory 120. FIG. 13 is a graph showing a correlation between the power ratio and the delay time, defined in the second lookup table. As can be seen from the graph of FIG. 13, with the increasing first power ratio in the charging direction, the second delay time associated with it may increase. The control unit 130 determines the second weighting factor based on the second delay time. The control unit 130 may determine the second weighting factor $W_{p\_c}$ using the following Equation 21.

$$W_{p\_c} = \frac{T_{p\_c\_s}}{T_{p\_c\_s} + T_{p\_c\_r}} \qquad \text{<Equation 21>}$$

$T_{p\_c\_s}$ is the second delay time, and $T_{p\_c\_r}$ is a given second reference time. The second reference time may be equal to or different from the first reference time. In Equation 21, it can be seen that $W_{p\_c}$ is equal to or greater than 0 and less than 1.

In step S1130, the control unit 130 sets a smaller one of the first weighting factor $W_{v\_c}$ and the second weighting factor $W_{p\_c}$ as a first reference weighting factor $W_{LPF\_c}$.

In step S1140, the control unit 130 smoothes the charge power limit $P_{raw\_c}$ based on the previous smoothed charge power limit $P_{s\_c\_pre}$ and the first reference weighting factor $W_{LPF\_c}$. Smoothing the charge power limit $P_{raw\_c}$ signifies calculating a weighted average of the previous smoothed charge power limit $P_{s\_c\_pre}$ and the charge power limit $P_{raw\_c}$ using the first reference weighting factor $W_{LPF\_c}$. The control unit 130 may smooth the charge power limit $P_{raw\_c}$ using the following Equation 22.

$$P_{s\_c} = W_{LPF\_c} P_{s\_c\_pre} + \{1 - W_{LPF\_c}\} P_{raw\_c} \qquad \text{<Equation 22>}$$

$P_{s\_c}$ is the smoothed charge power limit, and corresponds to a result of correcting the charge power limit $P_{raw\_c}$ by Equation 22.

In step S1150, the control unit 130 transmits a notification signal indicating the smoothed charge power limit $P_{s\_c}$ to the external device 2.

Figure 14:
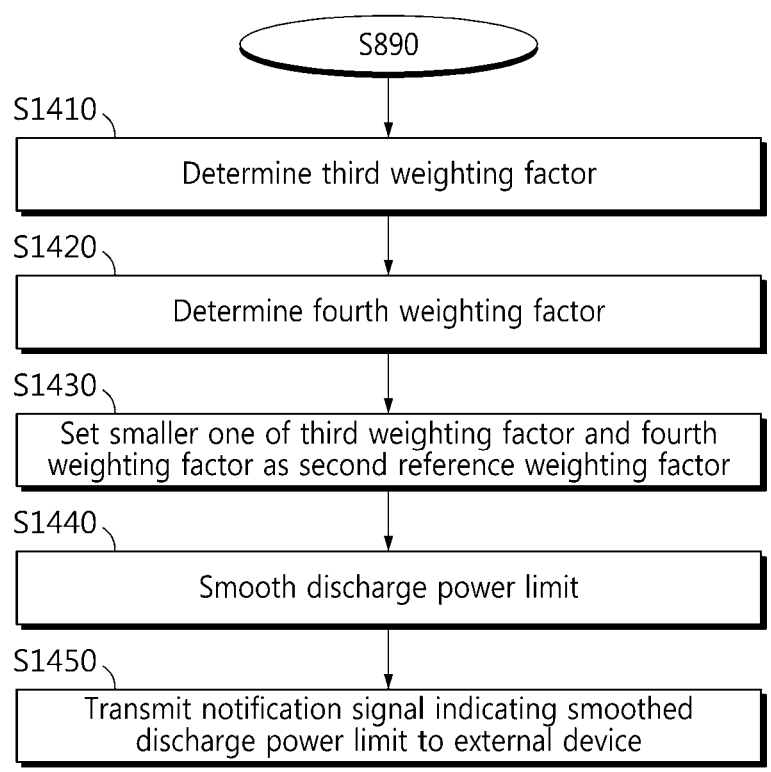
FIG. 14 is a flowchart showing a method for smoothing the discharge power limit of a battery according to another embodiment of the present disclosure.
Figure 15:
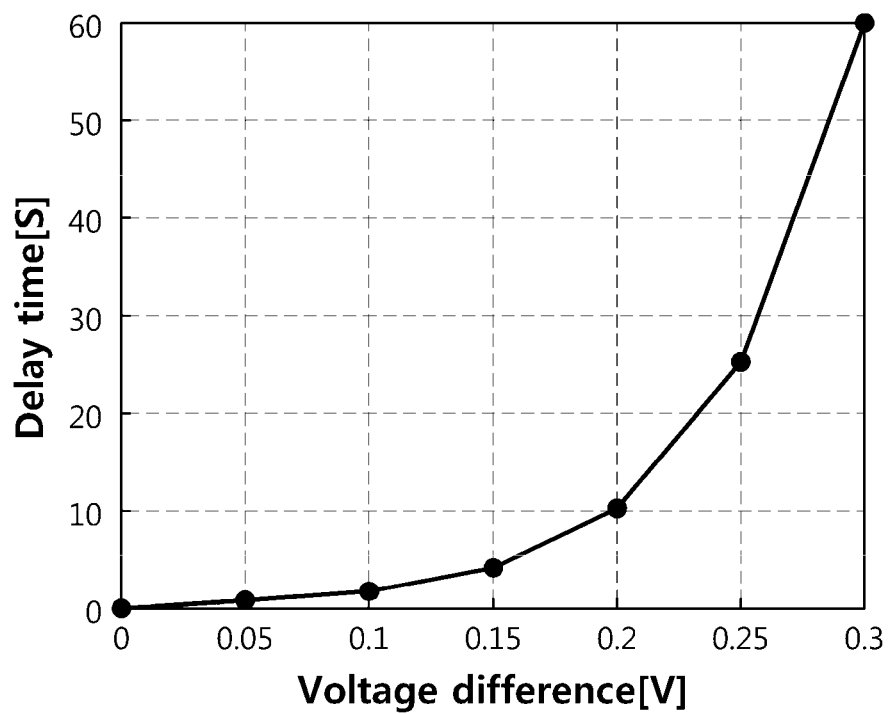
FIG. 15 shows an exemplary graph for reference in describing the method of FIG. 14.

FIG. 14 is a flowchart showing a method for smoothing the discharge power limit of the battery 10 according to another embodiment of the present disclosure, and FIG. 15 shows an exemplary graph for reference in describing the method of FIG. 14. The method of FIG. 14 starts after the discharge power limit at the current time step is determined through the method of FIG. 8.

Referring to FIG. 14, in step S1410, the control unit 130 determines a third weighting factor $W_{v\_d}$ based on the minimum discharge voltage $V_{min}$ and the measured terminal voltage V(n). In detail, the control unit 130 determines a second voltage difference V(n)–$V_{min}$ by subtracting the minimum discharge voltage $V_{min}$ from the measured terminal voltage V(n), and determines a third delay time associated with the second voltage difference from a given third lookup table stored in the memory 120. FIG. 15 is a graph showing a correlation between the voltage difference in the discharging direction and the delay time, defined in the third lookup table. As can be seen from the graph of FIG. 15, with the increasing second voltage difference in the discharging direction, the third delay time associated with it may increase. For example, when the second voltage difference=0.2V, the third delay time=10 sec, and when the second voltage difference=0.3V, the third delay time=60 sec. When the second voltage difference is a predetermined value (for example, 0.3V) or more, the control unit 130 may determine a given maximum delay time (for example, 60 sec) as the third delay time. The control unit 130 determines the third weighting factor $W_{v\_d}$ based on the third delay time. The control unit 130 may determine the third weighting factor $W_{v\_d}$ using the following Equation 23.

$$W_{v\_d} = \frac{T_{v\_d\_s}}{T_{v\_d\_s} + T_{v\_d\_r}} \qquad \text{<Equation 23>}$$

$T_{v\_d\_s}$ is the third delay time, and $T_{v\_d\_r}$ is a given third reference time. In Equation 23, it can be seen that $W_{v\_d}$ is equal to or greater than 0 and less than 1. In step S1420, the control unit 130 determines a fourth weighting factor $W_{p\_d}$ based on the previous smoothed discharge power limit $P_{s\_d\_pre}$, the discharge power limit $P_{raw\_d}$ and the instantaneous power $P_{inst}$. $P_{s\_d\_pre}$ is the discharge power limit smoothed latest before the current time step, and may be a value stored in the memory 120. In detail, the control unit 130 determines a second power difference $P_{s\_d\_pre}-P_{inst}$ by subtracting the instantaneous power $P_{inst}$ from the previous smoothed discharge power limit $P_{s\_d\_pre}$, and determines a second power ratio indicating a relative size of the second power difference $P_{s\_d\_pre}-P_{inst}$ to the previous smoothed discharge power limit $P_{s\_d\_pre}$.

The control unit 130 determines a fourth delay time associated with the second power ratio from a given fourth lookup table stored in the memory 120. The fourth lookup table may be the same as the second lookup table, and its redundant description is omitted herein. The control unit 130 determines the fourth weighting factor based on the fourth delay time. The control unit 130 may determine the fourth weighting factor $W_{p\_d}$ using the following Equation 24.

$$W_{p\_d} = \frac{T_{p\_d\_s}}{T_{p\_d\_s} + T_{p\_d\_r}} \qquad \text{<Equation 24>}$$

$T_{p\_d\_s}$ is the fourth delay time, and $T_{p\_d\_r}$ is a given fourth reference time. The fourth reference time may be equal to or different from the third reference time. In Equation 24, it can be seen that $W_{p\_d}$ is equal to or greater than 0 and less than 1.

In step S1430, the control unit 130 sets a smaller one of the third weighting factor $W_{v\_d}$ and the fourth weighting factor $W_{p\_d}$ as a second reference weighting factor $W_{LPF\_d}$.

In step S1440, the control unit 130 smoothes the discharge power limit $P_{raw\_d}$ based on the previous smoothed discharge power limit $P_{s\_d\_pre}$ and the second reference weighting factor $W_{LPF\_d}$. Smoothing the discharge power limit $P_{raw\_d}$ signifies calculating a weighted average of the previous smoothed discharge power limit $P_{s\_d\_pre}$ and the discharge power limit $P_{raw\_d}$ using the second reference weighting factor $W_{LPF\_d}$. The control unit 130 may smooth the discharge power limit $P_{raw\_d}$ using the following Equation 25.

$$P_{s\_d} = W_{LPF\_d} P_{s\_d\_pre} + \{1-W_{LPF\_d}\}P_{raw\_d} \qquad \text{<Equation 25>}$$

$P_{s\_d}$ is the smoothed discharge power limit, and corresponds to a result of correcting the discharge power limit $P_{raw\_d}$ by Equation 25.

In step S1450, the control unit 130 transmits a notification signal indicating the smoothed discharge power limit $P_{s\_d}$ to the external device 2.

Data indicating the results of performing each step shown in FIGS. 3, 5, 6, 8, 11 and 14 may be stored in the memory 120 by the control unit 130 whenever each step is finished.

The embodiments of the present disclosure described hereinabove are not implemented only through the apparatus and method, and may be implemented through programs that perform functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

DESCRIPTION OF REFERENCE NUMERALS

1: Battery pack
10: Battery
20: Switch
100: Battery management system
110: Sensing unit
120: Memory
130: Control unit
140: Communication interface
200: Equivalent circuit model
210: First resistor
220: Second resistor
230: Capacitor

What is claimed is:

1. A method for smoothing a charge power limit of a battery, the method comprising:
  measuring a terminal voltage and a current of the battery;
  determining an instantaneous power of the battery based on the measured terminal voltage and the measured current;
  determining a charge current limit and a charge voltage limit of the battery;
  determining a charge power limit of the battery based on the charge current limit and the charge voltage limit;
  determining a first weighting factor based on a given maximum charge voltage and the measured terminal voltage;
  determining a second weighting factor based on a previous smoothed charge power limit, the charge power limit, and the instantaneous power;
  setting a smaller one of the first weighting factor and the second weighting factor as a first reference weighting factor;
  smoothing the charge power limit based on the previous smoothed charge power limit and the first reference weighting factor; and
  transmitting a notification signal indicating the smoothed charge power limit to an external device.

2. The method according to claim 1, wherein the determining the first weighting factor comprises:
  determining a first voltage difference by subtracting the measured terminal voltage from the maximum charge voltage;
  determining a first delay time associated with the first voltage difference from a given first lookup table defining a correlation between a voltage difference in a charging direction and a delay time; and
  determining the first weighting factor based on the first delay time.

3. The method according to claim 2, wherein the determining the first weighting factor uses the following Equation 1:

$$W_{v\_c} = \frac{T_{v\_c\_s}}{T_{v\_c\_s} + T_{v\_c\_r}}. \qquad \text{<Equation 1>}$$

where:

$T_{v\_c\_s}$ is the first delay time, $T_{v\_c\_r}$ is a given first reference time, and $W_{v\_c}$ is the first weighting factor.

4. The method according to claim 1, wherein the determining the second weighting factor comprises:

determining a first power difference by subtracting the instantaneous power from the previous smoothed charge power limit;

determining a first power ratio indicating a relative size of the first power difference to the previous smoothed charge power limit;

determining a second delay time associated with the first power ratio from a given second lookup table defining a correlation between a power difference and a delay time; and determining the second weighting factor based on the second delay time.

5. The method according to claim 4, wherein the determining the second weighting factor uses the following Equation 2:

$$W_{p\_c} = \frac{T_{p\_c\_s}}{T_{p\_c\_s} + T_{p\_c\_r}}.$$  <Equation 2> where:

$T_{p\_c\_s}$ is the second delay time, $T_{p\_c\_r}$ is a given second reference time, and $W_{p\_c}$ is the second weighting factor.

6. The method according to claim 1, wherein the smoothing the charge power limit uses the following Equation 3:

<Equation 3>

$P_{s\_c} \times W_{LPF\_C} P_{s\_c\,pre} + \}1 - W_{LPF\_C} = P_{raw\_C}$ where:

$W_{LPF\_c}$ is the first reference weighting factor, $P_{s\_c\,pre}$ is the previous smoothed charge power limit, $P_{raw\_c}$ is the charge power limit, and $P_{s\_c}$ is the smoothed charge power limit.

7. A method for smoothing a discharge power limit of a battery, the method comprising:

measuring a terminal voltage and a current of the battery;

determining an instantaneous power of the battery based on the measured terminal voltage and the measured current;

determining a discharge current limit and a discharge voltage limit of the battery;

determining a discharge power limit of the battery based on the discharge current limit and the discharge voltage limit;

determining a third weighting factor based on a given minimum discharge voltage and the measured terminal voltage;

determining a fourth weighting factor based on a previous smoothed discharge power limit, the discharge power limit and the instantaneous power;

setting a smaller one of the third weighting factor and the fourth weighting factor as a second reference weighting factor;

smoothing the discharge power limit based on the previous smoothed discharge power limit and the second reference weighting factor; and transmitting a notification signal indicating the smoothed discharge power limit to an external device.

8. The method according to claim 7, wherein the determining the third weighting factor comprises:

determining a second voltage difference by subtracting the measured terminal voltage from the minimum discharge voltage;

determining a third delay time associated with the second voltage difference from a given third lookup table defining a correlation between a voltage difference in a discharging direction and a delay time; and determining the third weighting factor based on the third delay time.

9. The method according to claim 7, wherein the determining the fourth weighting factor comprises:

determining a second power difference by subtracting the instantaneous power from the previous smoothed discharge power limit;

determining a second power ratio indicating a relative size of the second power difference to the previous smoothed discharge power limit;

determining a fourth delay time associated with the second power ratio from a given fourth lookup table defining a correlation between a power ratio and a delay time; and determining the fourth weighting factor based on the fourth delay time.

10. The method according to claim 7, wherein the smoothing the discharge power limit uses the following Equation 4:

<Equation 4>

$P_{s\_d} \times W_{LPF\_d} P_{s\_d\,pre} + \}1 - W_{LPF\_d} = P_{raw\_d}$ where:

$W_{LPF\_d}$ is the second reference weighting factor, $P_{s\_d\,pre}$ re is the previous smoothed discharge power limit, $P_{raw\_d}$ is the discharge power limit, and $P_{s\_d}$ is the smoothed discharge power limit.

11. A battery management system for smoothing a charge power limit of a battery, comprising:

a sensing unit configured to measure a terminal voltage and a current of the battery; and a control unit operably coupled to the sensing unit, the control unit being configured to:

determine an instantaneous power of the battery based on the measured terminal voltage and the measured current;

determine a charge current limit and a charge voltage limit of the battery;

determine a charge power limit of the battery based on the charge current limit and the charge voltage limit;

determine a first weighting factor based on a given maximum charge voltage and the measured terminal voltage;

determine a second weighting factor based on a previous smoothed charge power limit, the charge power limit and the instantaneous power;

set a smaller one of the first weighting factor and the second weighting factor as a first reference weighting factor;

smooth the charge power limit based on the previous smoothed charge power limit and the first reference weighting factor; and transmit a notification signal indicating the smoothed charge power limit to an external device.

12. The battery management system of claim 11, wherein the control unit is further configured to:

determine a discharge current limit and a discharge voltage limit of the battery determine a discharge power limit of the battery based on the discharge current limit and the discharge voltage limit;

determine a third weighting factor based on a given minimum discharge voltage and the measured terminal voltage;

determine a fourth weighting factor based on a previous smoothed discharge power limit, the discharge power limit and the instantaneous power;

set a smaller one of the third weighting factor and the fourth weighting factor as a second reference weighting factor;

smooth the discharge power limit based on the previous smoothed discharge power limit and the second reference weighting factor; and transmit a notification signal indicating the smoothed discharge power limit to an external device.

* * * * *